United States Patent
Zhang

(10) Patent No.: US 9,368,488 B2
(45) Date of Patent: Jun. 14, 2016

(54) EFFICIENT INTEGRATION OF CMOS WITH POLY RESISTOR

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 11 days.

(21) Appl. No.: 14/022,183

(22) Filed: Sep. 9, 2013

(65) Prior Publication Data

US 2015/0069522 A1   Mar. 12, 2015

(51) Int. Cl.
| | |
|---|---|
| H01L 21/335 | (2006.01) |
| H01L 27/06 | (2006.01) |
| H01L 29/78 | (2006.01) |
| H01L 21/265 | (2006.01) |
| H01L 21/28 | (2006.01) |
| H01L 29/66 | (2006.01) |

(52) U.S. Cl.
CPC ...... *H01L 27/0629* (2013.01); *H01L 21/26513* (2013.01); *H01L 21/28052* (2013.01); *H01L 29/6659* (2013.01); *H01L 29/7833* (2013.01); H01L 21/26586 (2013.01); H01L 29/665 (2013.01)

(58) Field of Classification Search
CPC ............. H01L 23/647; H01L 27/0629; H01L 27/0738; H01L 27/105; H01L 29/435; H01L 27/10894; H01L 21/0465
See application file for complete search history.

(56) References Cited

U.S. PATENT DOCUMENTS

| | | | | |
|---|---|---|---|---|
| 6,057,191 | A * | 5/2000 | Moroni | H01L 21/28512 257/E21.162 |
| 2009/0090977 | A1* | 4/2009 | Freeman | H01L 21/28088 257/379 |
| 2010/0112764 | A1* | 5/2010 | Mehrotra | H01L 27/0629 438/210 |
| 2010/0289113 | A1* | 11/2010 | Bourdelle | H01L 21/187 257/506 |

\* cited by examiner

*Primary Examiner* — Matthew W Such
*Assistant Examiner* — Stephen C Smith
(74) *Attorney, Agent, or Firm* — Horizon IP Pte. Ltd.

(57) ABSTRACT

Device and methods for forming a device are presented. The method includes providing a substrate. The substrate includes a resistor region defined by a resistor isolation region. A resistor gate is formed on the resistor isolation region. An implant mask with an opening exposing the resistor region is formed. Resistor well dopants are implanted to form a resistor well in the substrate. The resistor well is disposed in the substrate below the resistor isolation region. Resistor dopants are implanted into the resistor gate to define the sheet resistance of the resistor gate. Terminal dopants are implanted to form first and second resistor terminals at sides of the resistor gate. A central portion of the resistor gate sandwiched by the resistor terminals serves as a resistive portion.

17 Claims, 10 Drawing Sheets

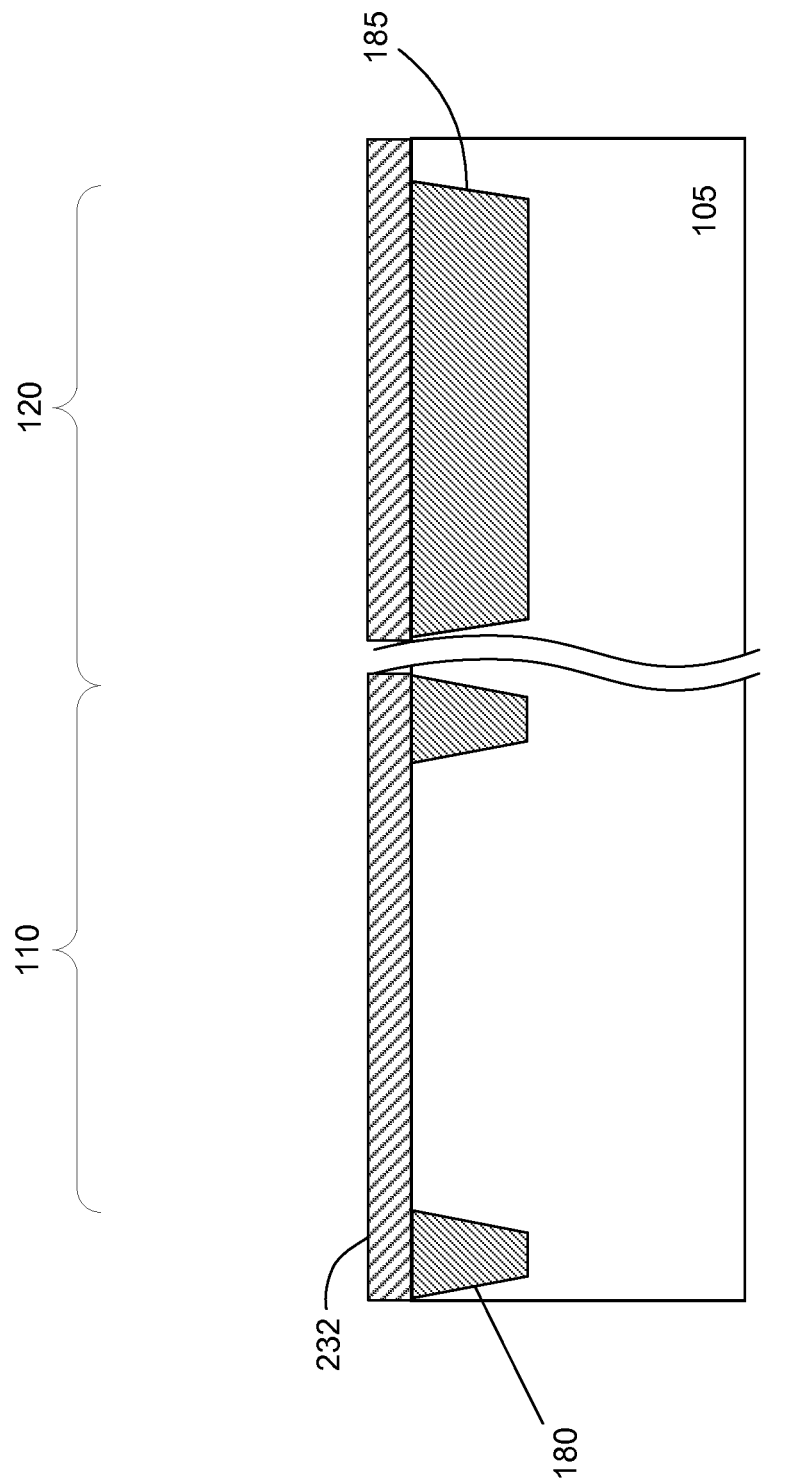

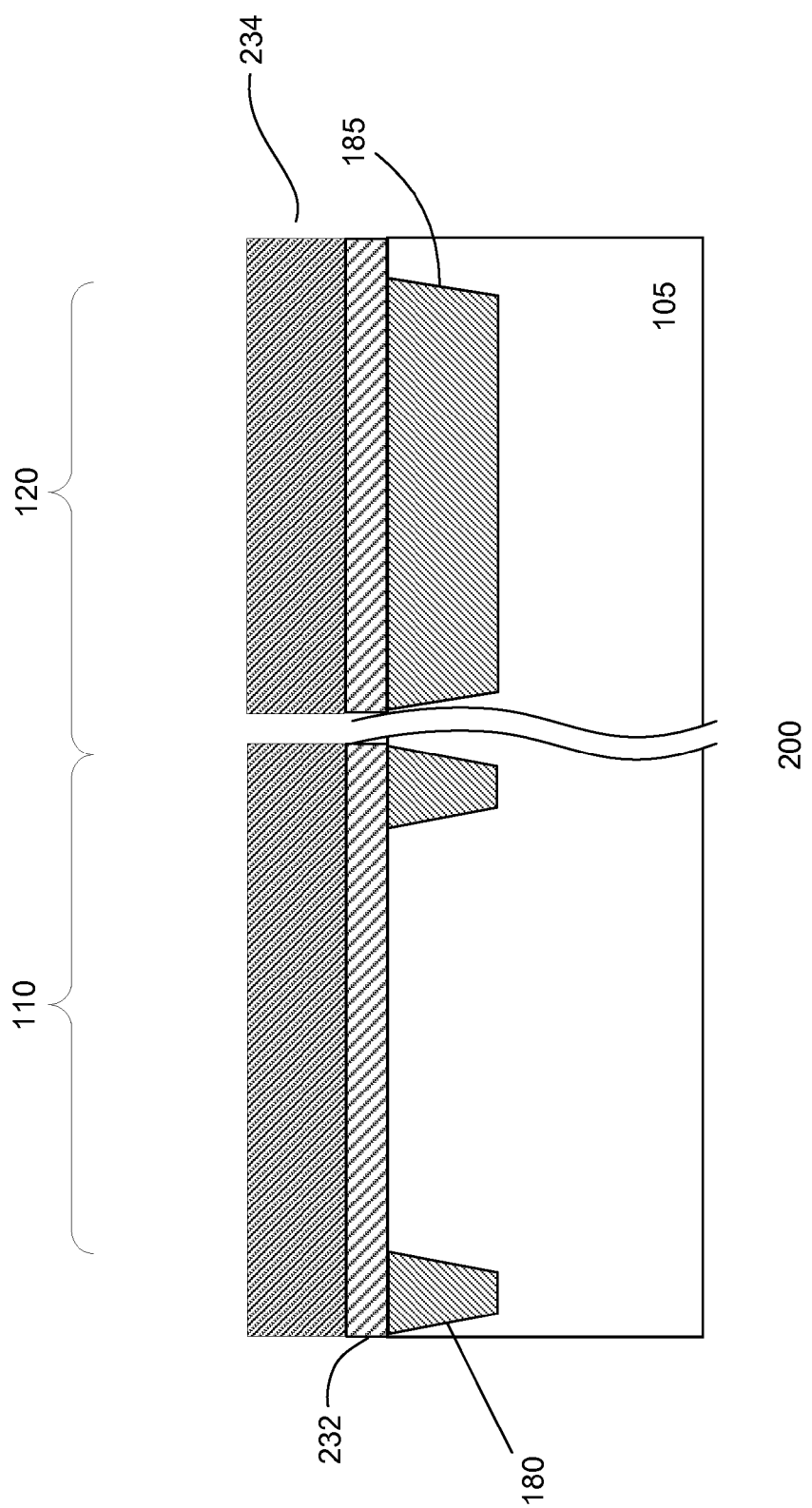

EFFICIENT INTEGRATION OF CMOS WITH POLY RESISTOR

BACKGROUND

High resistance resistors are widely employed in integrated circuits (ICs). For example, on-chip resistors are integrated onto the substrate or die of the IC. Conventional integration of on-chip resistors requires complex or additional processing. This results in undesirably increasing manufacturing costs of ICs.

From the foregoing discussion, it is desirable to provide efficient and cost-effective on-chip resistors.

SUMMARY

Embodiments generally relate to semiconductor devices and methods for forming a device. In one embodiment, a method for forming a device is presented. The method includes providing a substrate. The substrate includes a resistor region defined by a resistor isolation region. A resistor gate is formed on the resistor isolation region. An implant mask with an opening exposing the resistor region is formed. Resistor well dopants are implanted to form a resistor well in the substrate. The resistor well is disposed in the substrate below the resistor isolation region. Resistor dopants are implanted into the resistor gate to define the sheet resistance of the resistor gate. Terminal dopants are implanted to form first and second resistor terminals at sides of the resistor gate. A central portion of the resistor gate sandwiched by the resistor terminals serves as a resistive portion.

In another embodiment, a method for forming a device is presented. The method includes providing a substrate transistor region and a resistor region. The transistor region is prepared with a transistor gate and the resistor region is prepared with a resistor gate. A first implant mask is formed on the substrate. The implant mask includes an opening to expose the transistor and resistor regions. The method further includes using the first implant mask and, performing a well implant to implant well dopants in the substrate to form a transistor well in the transistor region and a resistor well in the resistor region, performing a LDD implant to implant LDD dopants in the substrate to form LDD regions in the transistor region adjacent to the transistor gate, and performing a resistor implant to adjust the resistance of the resistor gate.

In yet another embodiment, a device is presented. The device includes a substrate with a transistor region and a resistor region. The device further includes a transistor in the transistor region, wherein the transistor includes a transistor gate on the substrate. The transistor gate has a transistor gate electrode over a transistor gate dielectric, and first and second source/drain (S/D) regions in the substrate adjacent first and second sides of the transistor gate. The device further includes a resistor in the resistor region, wherein the resistor includes a resistor gate. The resistor gate has a resistor region between first and second resistor terminals. The resistor region includes resistor (R) dopants to determine the resistance of the resistor region. The transistor gate electrode includes R dopants.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-i show an embodiment of a process for forming a device.

DETAILED DESCRIPTION

Embodiments generally relate to semiconductor devices. In one embodiment, the devices include a resistor. The resistor, for example, is a high resistance resistor. The devices, for example, may be any type of semiconductor devices, such as complementary metal oxide semiconductor (CMOS) devices, forming integrated circuits (ICs). The devices can be incorporated into or used with, for example, electronic products, computers, cell phones, and personal digital assistants (pDAs). The devices may also be incorporated into other types of products.

Figure 1:
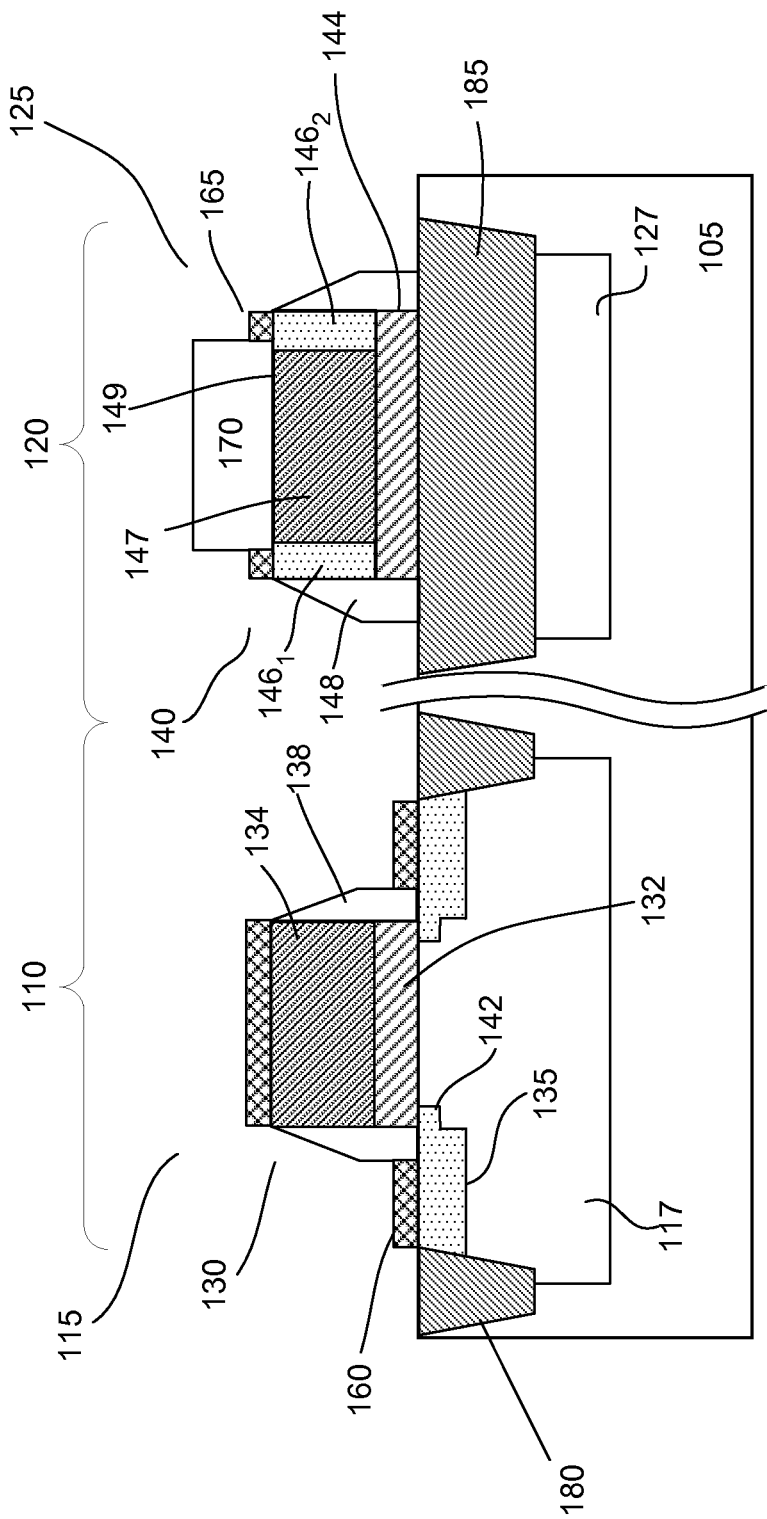
FIG. 1 shows a cross-sectional view of an embodiment of a device.

FIG. 1 shows a cross-sectional view of a portion of an embodiment of a device 100. The device, for example, is a CMOS device. Other types of devices may also be useful. The device includes a substrate 105. The substrate, for example, may be a silicon substrate. The substrate can be lightly doped with p-type dopants. Other types of semiconductor substrates, such as substrates doped with other types of dopants or concentrations (including intrinsic or undoped), may also be used. For example, the substrate may be a silicon-germanium, germanium, gallium-arsenide, or crystal-on-insulator (COI) such as silicon-on-insulator (SOI).

As shown, the substrate includes first and second device regions 110 and 120. In one embodiment, the first device region is a transistor region. The transistor region includes a transistor 115. The transistor, for example, is a metal oxide semiconductor (MOS) transistor. Other types of transistors may also be useful.

The transistor region includes a transistor isolation region 180. The isolation region, for example, surrounds the transistor region. In one embodiment, the isolation is a shallow trench isolation (STI) region. Other types of isolation regions may also be useful. For example, the isolation region may be a deep trench isolation (DTI) region. The isolation region, for example, extends to a depth of about 4000 Å for an STI region. providing isolation regions which extend to other depths, such as 0.5-10 µm for DTI regions, may also be useful. In one embodiment, the width of the isolation region is about 0.3 µm. providing isolation regions having different depths and widths may also be useful. The dimensions, for example, may depend on isolation requirements.

The transistor region may include doped regions or wells having different dopant concentrations. For example, the device may include heavily doped, intermediately doped and lightly doped regions. The doped regions may be designated by $x^-$, $x$ and $x^+$, where x indicates the polarity of the doping, such as p-type or n-type, and:

$x^-$=lightly doped;
$x$=intermediately doped; and
$x^+$=heavily doped.

A lightly doped region may have a dopant concentration of less than about $5E13/cm^2$, an intermediately doped region may have a dopant concentration of about $5E13-5E15/cm^2$, and a heavily doped region may have a dopant concentration of more than about $5E15/cm^2$. Other dopant concentrations for the different doped levels may also be useful. The concentrations, for example, may depend on the technology node. p-type dopants may include boron (B), aluminum (Al), indium (In) or a combination thereof, while n-type dopants may include phosphorus (p), arsenic (As), antimony (Sb) or a combination thereof.

In one embodiment, a transistor doped well 117 is disposed in the substrate in the device region. The transistor doped well, as shown, encompasses the complete device region. For example, the transistor doped well is disposed in the substrate in the device region, extending between inner and outer edges of the isolation region. In one embodiment, the transistor well is sufficiently deep to accommodate the transistor. The transistor well, for example, extends to a depth of about 1-5 µm. In one embodiment, the depth is about 2 µm. providing the transistor well having other depths may also be useful.

The transistor well includes second polarity type dopants. In one embodiment, the second polarity is n-type. Alternatively, the second polarity type is p-type. The second polarity type doped well is for a first polarity type transistor. For example, n-type doped transistor well is for a p-type transistor. providing a p-type transistor well for a n-type transistor may also be useful. In one embodiment, the transistor well is lightly doped with second polarity type dopants. For example, the dopant concentration of the transistor well may be about $1E11-9E13/cm^2$. In one embodiment, the first polarity type is n-type. For example, the deep device doped well may be n⁻ doped well for n-type device. providing p-type as the first polarity type is also useful.

The transistor includes a gate 130 disposed on the surface of the substrate in the device region. The gate, for example, includes a gate electrode 134 over a gate dielectric 132. In one embodiment, the gate electrode is a polysilicon gate electrode. The gate electrode may be, for example, about 500-5000 Å thick. As for the gate dielectric, it may be formed of silicon oxide. The thickness of the gate dielectric may be, for example, about 10-500 Å. Other types of gate dielectrics or thicknesses may also be useful.

Dielectric sidewall spacers 138 may be disposed on sidewalls of the gate. The sidewall spacers, for example, may be silicon oxide. Other types of dielectric materials or combination of materials may be used for the spacers.

The gate may be a gate conductor, extending multiple transistor regions. For example, the gate conductor is a common gate for a plurality of transistors. Other configurations of the gate may also be useful.

Doped regions 135 are disposed in the substrate in the device region adjacent to sidewalls of the gate. The doped regions serve as source/drain (S/D) regions of the transistor. The S/D regions, in one embodiment, are heavily doped with first polarity type dopants for a first type transistor. For example, the doped regions are heavily doped p-type (p⁺) regions for a p-type transistor. Providing heavily doped n-type (n⁺) regions may also be useful for a n-type transistor. The heavily doped regions, for example, have a dopant concentration of about $1E15-1E17/cm^2$. Other dopant concentrations for the doped regions may also be useful. The depth of the doped regions may be about 0.1-0.4 µm. providing doped regions having other depths may also be useful.

The transistor may include lightly doped drain (LDD) regions 142. The LDD regions extend from the S/D regions to under the gate. The LDD regions, in one embodiment, are lightly doped with first polarity type dopants. The LDD regions, for example, have a dopant concentration of about $5E13-5E15/cm^2$. Other dopant concentrations for the doped regions may also be useful. The depths of the LDD regions are shallower than the S/D regions. For example, the depths of the LDD regions may be about 0.05-0.3 µm. providing LDD regions having other depths may also be useful.

Transistor contacts 160 may be formed on the contact regions of the transistor, such as the S/D regions and gate electrode. In one embodiment, the contacts are metal silicide contacts. For example, the contacts may be nickel silicide contacts. providing other types of contacts may also be useful.

As for the resistor region, it includes a resistor isolation region 185. The resistor isolation region defines the resistor region. The resistor isolation region, for example, may be similar to the transistor isolation regions. For example, the resistor isolation region may be an STI region, having similar depth as the transistor isolation region. The surface area of the resistor isolation region, for example, depends on the size of the resistor. As shown, the resistor isolation region and transistor isolation region are separate. preferably, the isolation regions are the same type of isolation regions. providing different types of isolation regions may also be useful. In some cases, the transistor and resistor may share a common isolation region. Other configurations of resistor and transistor isolation regions may also be useful. For example, the resistor isolation region may be a field oxide isolation region.

The resistor region may include a resistor well 127. The resistor well is disposed in the resistor region below the resistor isolation region. In one embodiment, the doped well is disposed within the boundaries of the resistor isolation region. The resistor well may be doped with the same polarity type dopants as the transistor well. For example, the resistor well may be doped with second polarity type dopants. The resistor well may be formed using the same process as the transistor well. For example, the resistor well may be lightly doped with second polarity type dopants. For example, the dopant concentration of the transistor well may be about $1E11-9E13/cm^2$. Other configurations of the resistor and transistor well may also be useful. For example, the resistor well may be doped with first polarity type dopants. In some cases, no resistor well may be provided in the resistor region.

The resistor region includes a resistor gate 140 disposed on the surface of the substrate. For example, the resistor gate is disposed over and within the resistor isolation region. The gate, for example, includes a resistor gate electrode 149 over a resistor gate dielectric 144. In one embodiment, the gate electrode is a polysilicon gate electrode. The gate electrode may be, for example, about 500-5000 Å thick. As for the gate dielectric, it may be formed of silicon oxide. The thickness of the gate dielectric may be, for example, about 10-500 Å. Other types of gate dielectrics or thicknesses may also be useful.

Dielectric sidewall spacers 148 may be disposed on sidewalls of the resistor gate. The sidewall spacers, for example, may be silicon oxide. Other types of dielectric materials or combination of materials may be used for the spacers. In one embodiment, the dielectric spacers are similar to those on the transistor gate. For example, the resistor and transistor spacers may be of the same material and thickness. Other configurations of the spacers of the resistor and transistor gates may also be useful.

In one embodiment, the gates of the transistor and resistor are similar. For example, the gates may be formed of the same materials and structure. The gate elements may have the same thicknesses, such as gate electrode and gate dielectric. As for the width or length, they may depend on design requirements, such as resistance and performance. providing resistor and transistor gates which are similar advantageously increases integration compatibility. For example, the gates may be created in the same process, avoiding the need of additional or separate processes. providing the first and second gates which are different may also be useful. For example, the various components of the first and second gates may be formed of different materials or have different configurations.

In one embodiment, the resistor gate electrode includes first and second terminal regions $146_{1-2}$ separated by a resistive region 147. The terminal regions are disposed in side portions of the resistor gate at first and second sides while the resistive region is disposed in a central portion of the resistor gate. The terminal regions, in one embodiment, are heavily doped regions with first polarity type dopants. In one embodiment, the terminal regions may be similar to the S/D regions. For example, the dopant concentrations of the terminal and S/D regions may be about the same. As for the resistive portion, it includes resistor (R) dopants. The R dopants, for example, may be first polarity type dopants. providing R dopants of the second polarity type may also be useful. The dopant concentration of R dopants in the resistive region is tailored to achieve the desired sheet resistance. The dopant concentration of R dopants, for example, may be lower than the dopant concentration of the S/D regions. The resistive region, for example, may be tailored to have a typical sheet resistance of 1-2 KΩ/sq. providing the resistive region with other sheet resistances may also be useful.

In one embodiment, the gate electrode of the transistor gate includes R dopants. However, since the R dopants do not penetrate the gate oxide and into the channel region, the performance of the transistor should not be impacted or negatively affected.

Resistor contacts 165 may be disposed on the contact regions of the resistor, such as the terminal portions. In one embodiment, the contacts are metal silicide contacts. For example, the contacts may be nickel silicide contacts. providing other types of contacts may also be useful. In one embodiment, the resistor contacts may be similar to the transistor contacts. Other configurations of transistor and resistor contacts may also be useful.

A salicidation block 170 is provided. The salicidation block is disposed on the resistor gate electrode, covering the resistive region. The salicidation block prevents the formation of resistor contacts in the resistive region. For example, the salicidation block prevents the salicidation of silicon in the resistive region. The salicidation block may be removed after resistor contacts have been formed.

The device, as described, includes a transistor region with a first polarity type transistor 115 and a resistor region with a first polarity type resistor 125. It is understood that the device may include a plurality of first polarity type transistor and resistor regions. Additionally, other device regions may also be included. For example, the device may include transistor regions for second polarity type transistors. The device may also include resistor regions for second polarity type resistors. Furthermore, additional or other device regions may also be included.

Figure 2A:
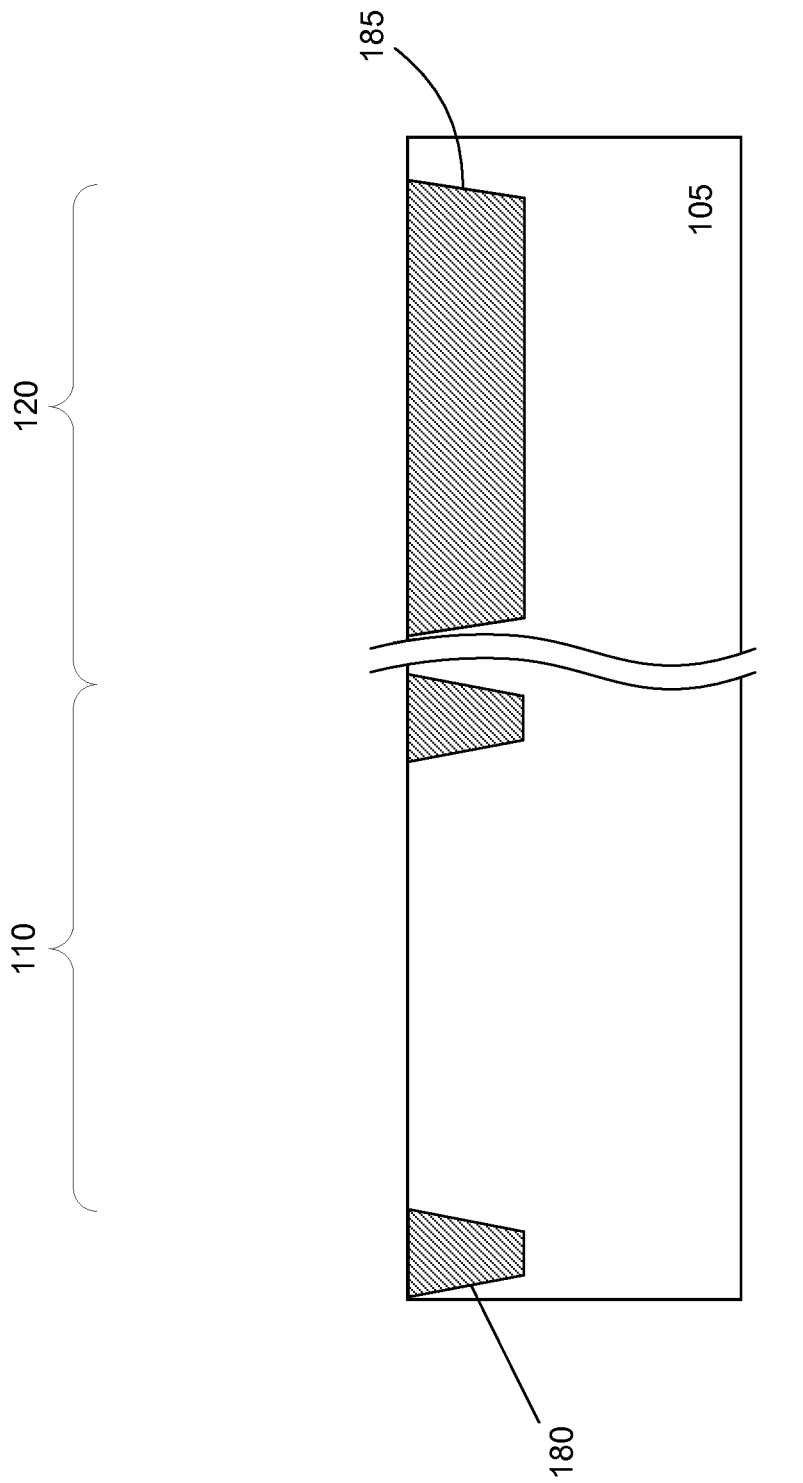

FIGS. 2a-i show an embodiment of a process 200 for forming a device. The process is illustrated by cross-section views of the device along a channel length direction. The device, for example, is a CMOS device. Other types of devices may also be useful. Referring to FIG. 2a, a substrate 105 is provided. The substrate, for example, may be a silicon substrate. The substrate can be lightly doped with p-type dopants. Other types of semiconductor substrates, such as substrates doped with other types of dopants or concentrations (including intrinsic or undoped), may also be used. The substrate, for example, may be a silicon-germanium, germanium, gallium-arsenide, or crystal-on-insulator (COI) such as silicon-on-insulator (SOI).

The substrate includes first and second device regions 110 and 120 defined thereon. In one embodiment, the first device region is a transistor region. The transistor region is for a transistor. The transistor, for example, is a metal oxide semiconductor (MOS) transistor. Other types of transistors may also be useful. The second device region is a resistor region. The substrate may include other types of device regions (not shown).

The substrate is prepared with isolation regions. In one embodiment, the transistor region is prepared with a transistor isolation region 180. The transistor isolation region surrounds the transistor region, for example, isolating it from other device regions. As for the resistor region, a resistor isolation region 185 is provided. The resistor isolation region defines the resistor region. The isolation regions, for example, may be STI regions. Other types of isolation regions may also be useful. For example, the isolation regions may be DTI regions. The isolation regions may be formed by etching trenches (or recesses) in a surface of the substrate and filling the trenches with a dielectric material. To provide a planar substrate top surface, excess dielectric material may be removed by, for example, polishing, such as chemical mechanical polishing (CMP). Other processes or materials can also be used to form the STI. The isolation region, for example, extends to a depth of about 4000 Å. providing isolation regions which extend to other depths, such as 0.5-10 μm for DTI regions, may also be useful. The dielectric material of the trench isolation regions may include silicon dioxide, silicon nitride, silicon oxy-nitride, and fluoride-doped silicate. Other types of dielectric materials may also be useful.

Referring to FIG. 2b, a dielectric layer 232 is formed on the surface of the substrate. For example, the dielectric layer covers the first and second device regions. The dielectric layer serves as a gate dielectric layer. The dielectric layer may be a silicon oxide layer. Other types of dielectric layers may also be useful, such as silicon oxynitride or high-k materials. The dielectric layer may be formed using various techniques, such as thermal oxidation or chemical vapor deposition (CVD). In one embodiment, the dielectric layer is silicon oxide layer formed by thermal oxidation. The thermal oxidation may either be dry or wet oxidation at a temperature of about 800 to 1100° C. The thickness of the dielectric layer may be about 10-500 Å. Other thicknesses may also be useful. For example, the thickness of the dielectric layer may depend on the requirements of the transistor.

As shown in FIG. 2c, a gate electrode layer 234 is formed on the substrate. The gate electrode layer, for example, covers the first and second device regions. The gate electrode layer, in one embodiment, is a polycrystalline silicon (polysilicon) layer. The gate electrode layer may be about 500-5000 Å thick. Forming techniques, such as CVD, can be employed to form the gate electrode layer. Other forming techniques or thicknesses may also be useful. The gate electrode and gate dielectric layers, for example, serve as layers of a gate stack.

Figure 2D:
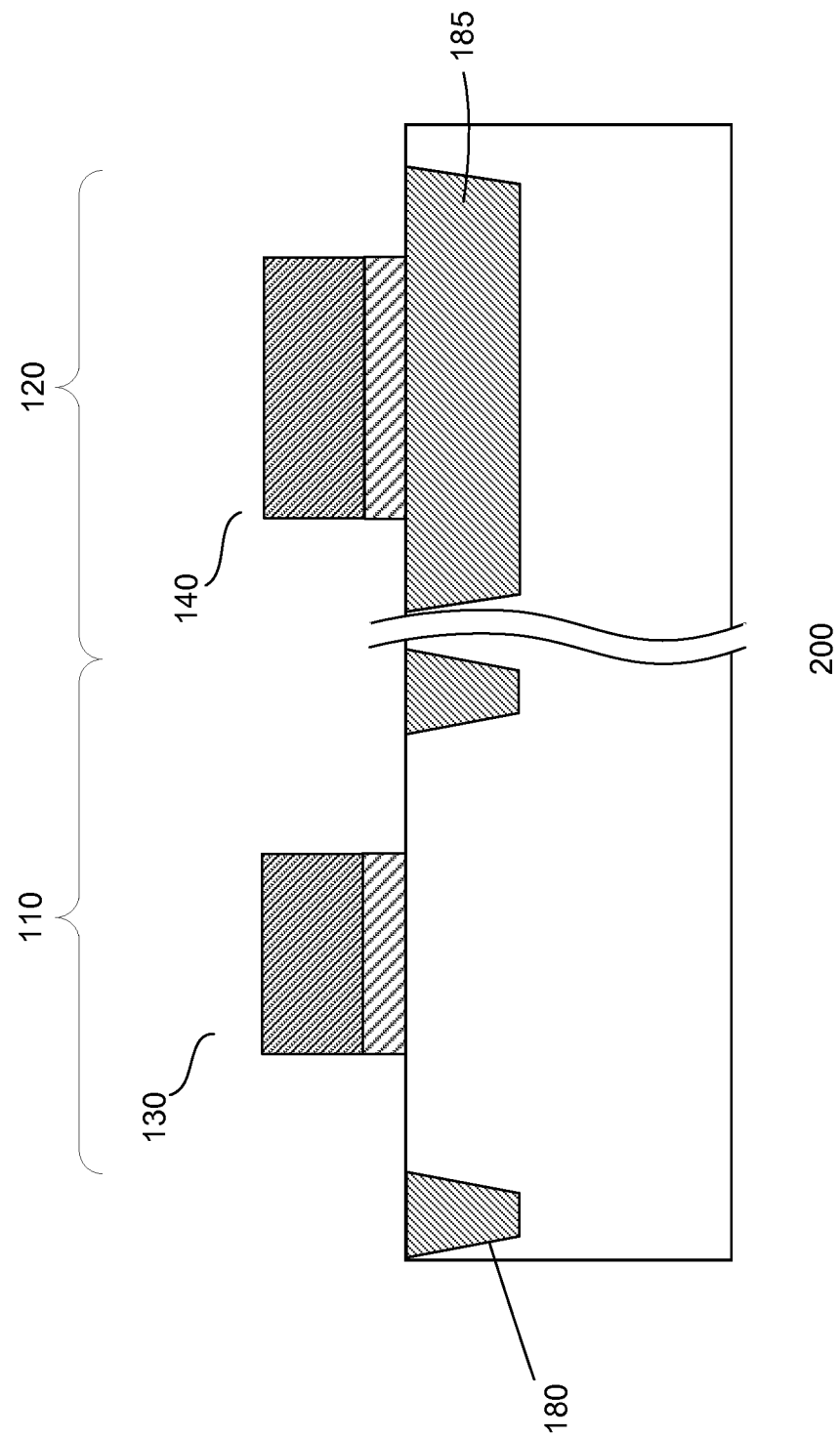

Referring to FIG. 2d, the layers of the gate stack are patterned to form a transistor gate 130 in the transistor region and a resistor gate 140 in the resistor region. patterning the layers of the gate stack may be achieved by, for example, mask and etch techniques. An anisotropic etch, such as RIE, may be employed using a patterned mask, such as photoresist, to pattern the gate stack layers. Multiple etches may be employed. For example, a first etch etches the gate electrode layer while a second etch etches the gate dielectric layer. The etches may be performed in-situ. Other techniques for patterning the gate stack layers may also be useful. After forming the gates, the mask is removed, for example, by ashing.

The gates may be gate conductors. For example, the transistor gate may be a transistor gate conductor which traverses a plurality of transistor regions, forming a plurality of transistors. Similarly, the resistor gate may be a resistor gate conductor which traverses, for example, multiple resistor regions, forming multiple resistors.

Figure 2E:
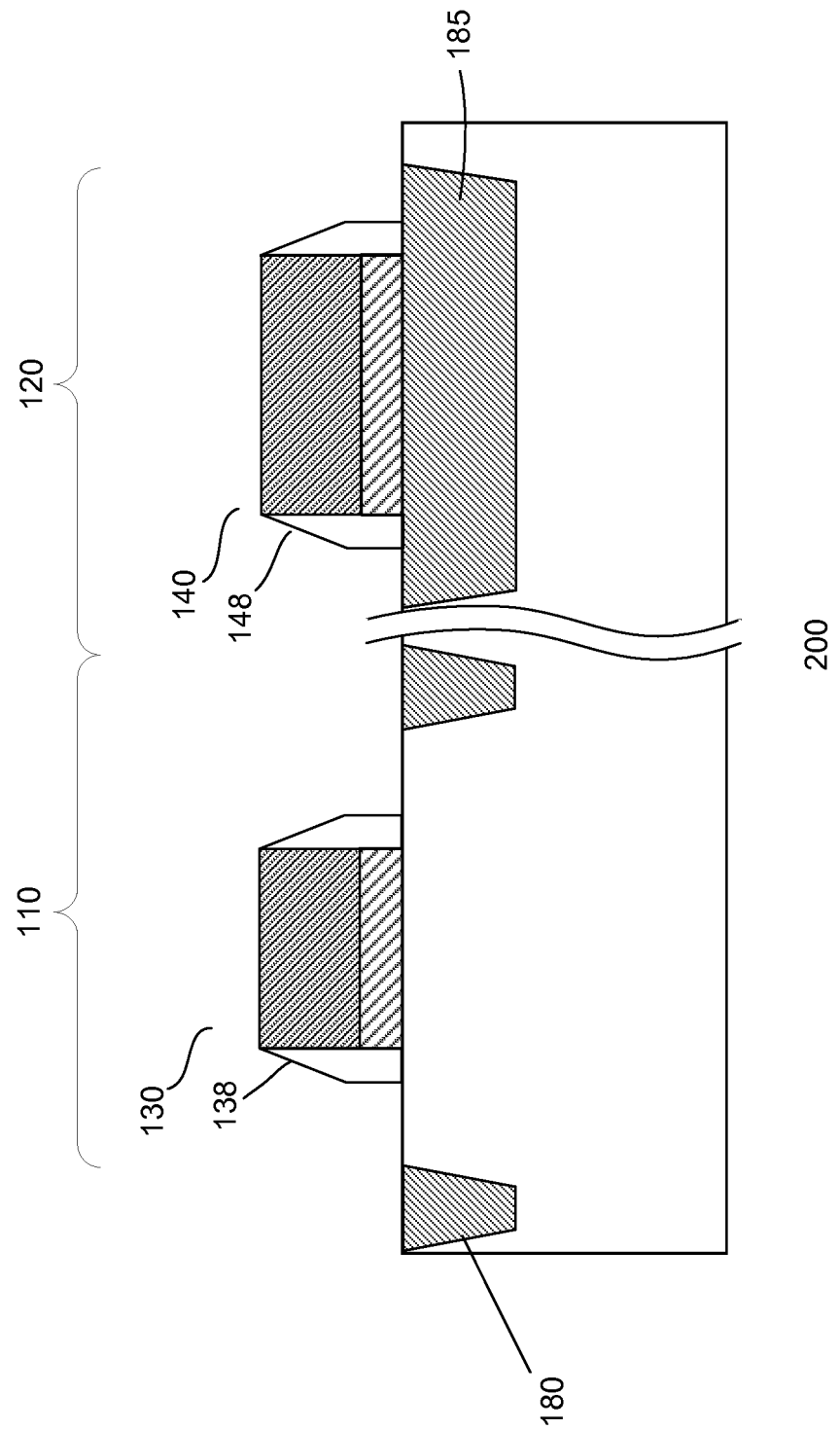

Referring to FIG. 2e, dielectric sidewall spacers 138 and 148 are formed on sidewalls of the transistor gate and resistor gate. The spacers, for example, are silicon oxide spacers. Other types of dielectric materials, including a dielectric stack, may also be useful. Forming the spacers, for example, includes depositing a spacer dielectric layer or stack on the substrate, covering the substrate and gates. An anisotropic etch, such as RIE, is performed to remove horizontal portions of the dielectric layer or stack to form spacers on sidewalls of the gates. Other techniques for forming the spacers may also be useful.

Figure 2F:
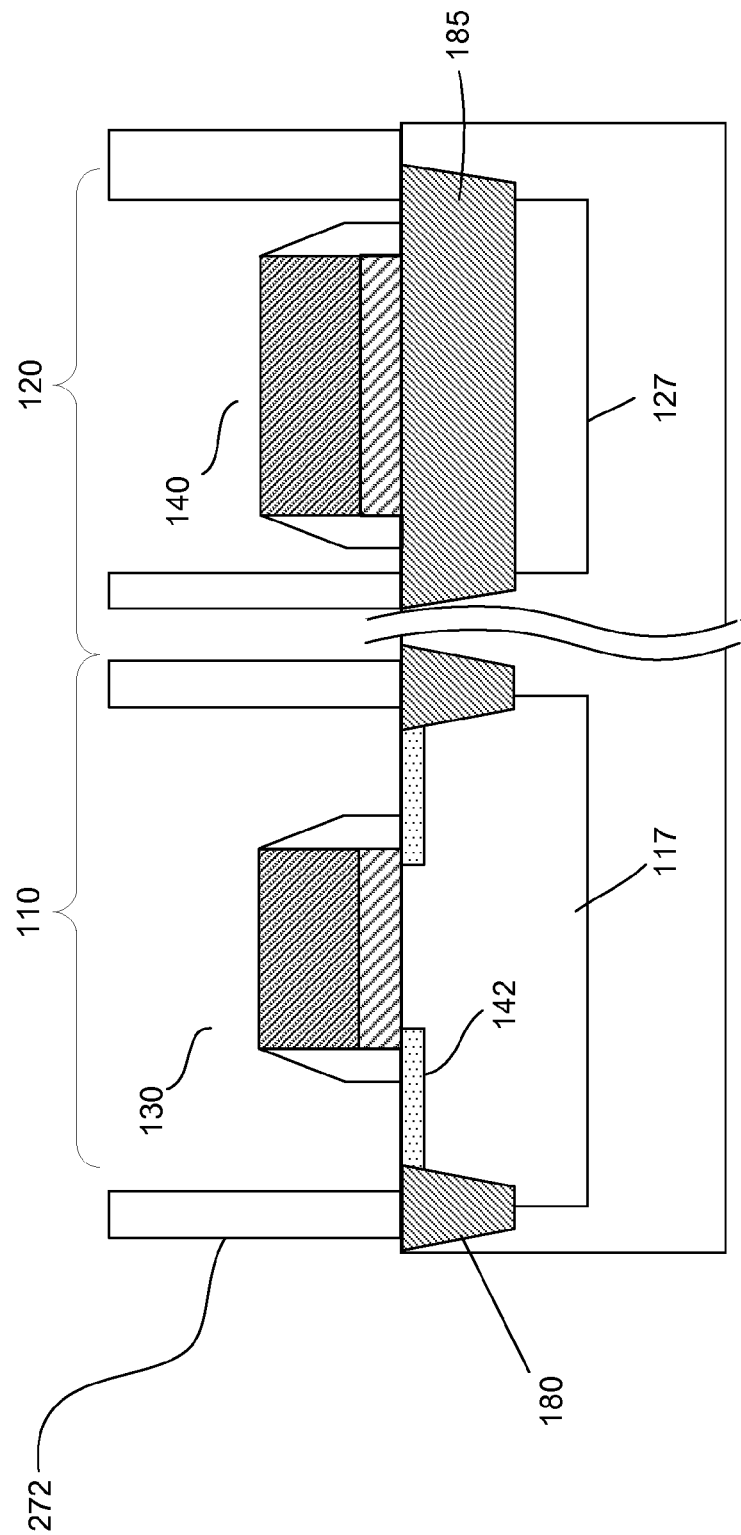

As shown in FIG. 2f, a mask layer 272 is formed on the substrate. The mask layer, for example, is photoresist. The mask layer is patterned to expose the transistor and resistor regions. The mask layer may be patterned by photolithographic techniques, such as exposure by an exposure source through a reticle with the desired pattern. The mask layer is developed, transferring the pattern of the reticle to the mask layer. In one embodiment, the mask layer serves as an implant mask. The height of the mask layer should be sufficient to prevent subsequent implants from penetrating the masked areas. For example, the height or thickness of the mask layer is sufficient to prevent a subsequent well implant from penetrating the masked areas. The height or thickness of the mask layer, for example, may be 2-3 µm above the gates. Other thicknesses may also be useful.

A well implant is performed. In one embodiment, the well implant forms a transistor well 117 in the transistor region and a resistor well 127 in the resistor region. The well implant implants second polarity type dopants into the substrate to form the wells. In one embodiment, the well implant is a high energy, low dose and low tilt angle implant. The implant, for example, may be performed at a tilt angle of 0-7° with respect to vertical direction (tilt angle is measured from a plane perpendicular to the substrate surface, with 0° being perpendicular to the substrate and 90° being parallel to the substrate surface). The dose may be from about 1E12 to 5E13 ions/cm$^2$ at an energy from about 300-5000 KeV. Other implant parameters may also be useful. For 0° implant, a single implant may be used. For implant having a tilt angle, the implant may be a quad implant. Using a single implant for a tilt angle implant may also be useful.

As shown, the well implant forms the transistor well in the transistor region. The transistor well, for example, has a depth of about 1-5 µm with an edge below a bottom of the transistor isolation region and a dopant concentration of about 1E11-5E13/cm$^3$. Other depths and dopant concentrations for the wells may also be useful.

A LDD implant is performed to form LDD regions 142 in the transistor region adjacent to the transistor gate. In one embodiment, the LDD implant implants first polarity type dopants into the substrate. The LDD implant is performed with a high tilt angle, low energy and intermediate dose. For example, the LDD implant may be performed at a tilt angle of about 7-45°. For example, the implant is a quad angle implant at about 7-45°. The energy of the implant may be about 5-100 KeV and the dose is about 1E13-1E14 ions/cm$^2$. Other implant parameters may also be useful. The LDD implant forms LDD regions, for example, having a dopant concentration of about 1E13-1E14/cm$^2$ and a depth of about 0.05-0.3 µm. Other dopant concentrations and depths for the doped regions may also be useful.

A resistor implant is performed to tune the resistance of the resistor. For example, the resistor implant implants R dopants into the resistor gate electrode. The R dopants, for example, are first polarity type dopants. providing R dopants of the second polarity type may also be useful. The implant is performed with low energy, low tilt angle and high dose. The implant, for example, is performed at a tilt angle of about 0-7°, energy of about 1-10 KeV and dose of about 5E14-1E15 ions/cm$^2$. The implant, depending on the angle, may be a single or quad implant. providing other implant parameters for the resistor implant may also be useful. The transistor gate electrode is also implanted with R dopants. However, due to the low energy of the resistor implant, dopants are prevented from penetrating into the transistor channel by the gate electrode and spacers. As such, the resistor implant should not negatively impact the operation of the transistor. It is understood that the different implants (e.g., well, LDD and resistor) may be performed in other sequences. For example, the implants may be performed in any sequence.

After performing the implants, the implant mask is removed. For example, the implant mask may be removed by ashing. Other techniques for removing the implant mask may also be useful.

As described, the doses for the well and LDD implants are relatively very low compared to that of the resistor implant. As such, the well and LDD implants have little effect on the resistance of the resistor gate. Additionally, since the resistor implant is conducted at low energy, it will be blocked by the transistor gate and spacer. Consequently, the resistor implant should not impact the performance of the transistor. Accordingly, the wells, LDD and resistor tuning can be advantageously performed using a single implant mask. This is in contrast to conventional devices which require three separate implant masks for wells, LDD and resistor tuning implants.

Figure 2G:
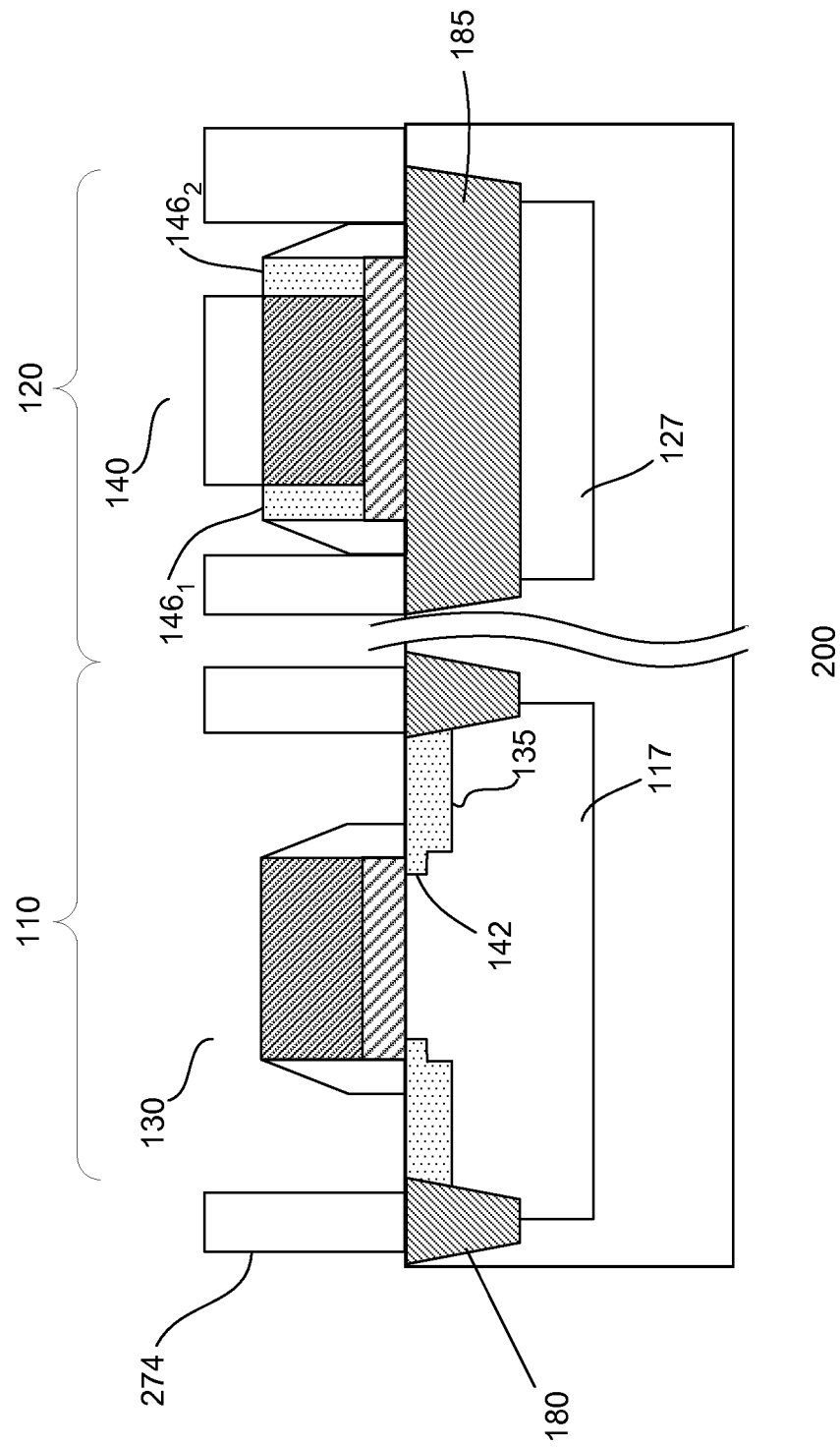

Referring to FIG. 2g, a S/D implant mask 274 is formed over the substrate. The implant mask, for example, is a photoresist mask. The S/D implant mask is patterned to form an opening in the transistor region and to expose terminal regions of the resistor in the resistor region. The implant mask protects the resistor region of the resistor gate between the terminal regions. A S/D implant is performed using the S/D implant mask. The S/D implant forms S/D regions 135 in the transistor region and first and second resistor terminals 146$_{1-2}$ in the sides of the resistor gate electrode, for example, adjacent to the spacers. In one embodiment, the S/D implant implants first polarity type dopants. The energy of the implant, for example, may be about 1-15 KeV with a dose of about 1E15-1E17 ions/cm$^2$. Other implant parameters may also be useful. The S/D regions and resistor terminals are heavily doped regions, for example, about 1E15-1E17/cm$^2$. Other dopant concentrations or implant parameters may also be useful.

After performing the S/D implant, the S/D implant mask is removed. For example, the implant mask may be removed by ashing. Other techniques for removing the implant mask may also be useful.

Figure 2H:
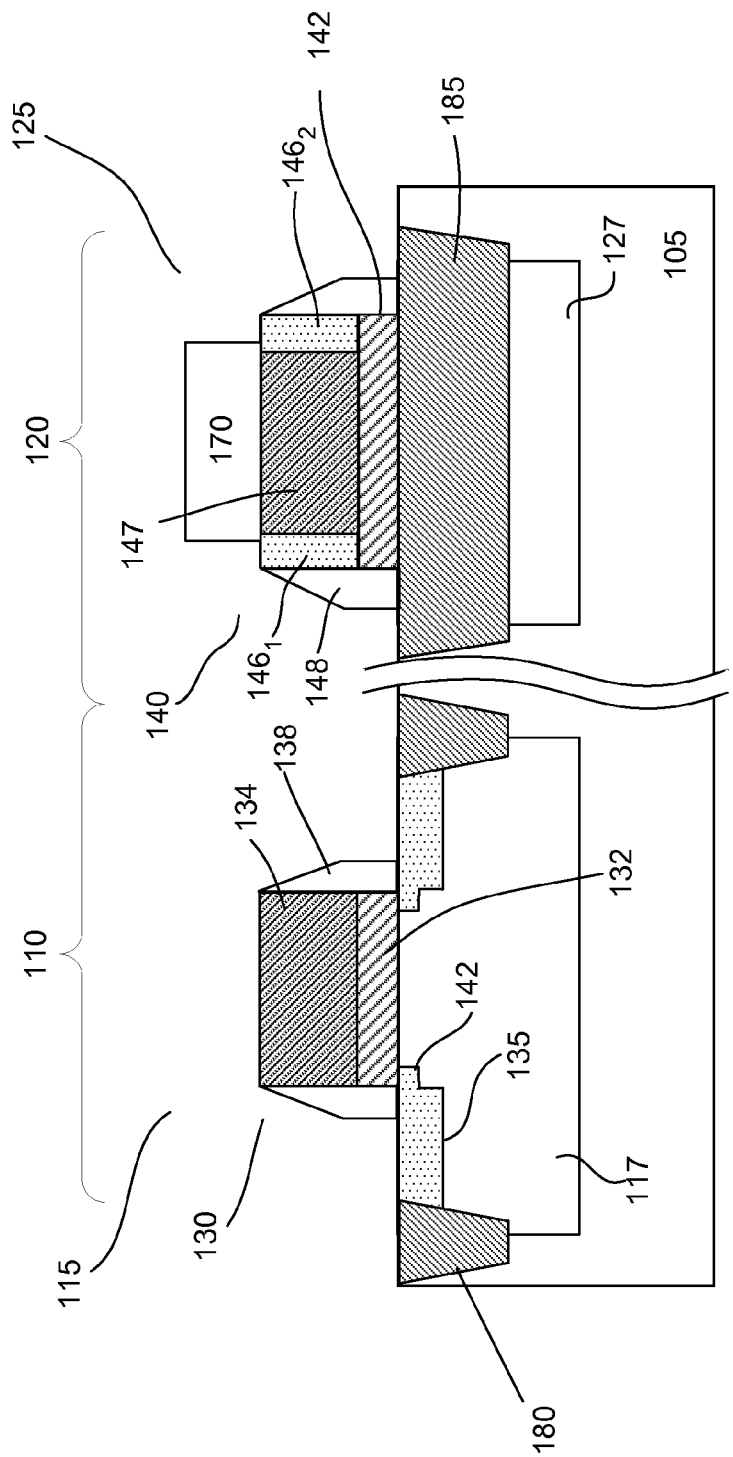

Referring to FIG. 2h, a salicidation block 170 is formed. The salicidation block is disposed on the resistor gate electrode, covering the resistive region. The salicidation block, as shown, extends a bit into the terminal regions. In one embodiment, the salicidation block is formed of dielectric material, such as silicon oxide, silicon nitride or silicon oxynitirde.

Other types of salicidation block materials may also be useful. The salicidation block layer may be, for example, about 100-1000 Å thick. In one embodiment, the salicidation block is about 500 Å thick. Other thicknesses may also be useful. To form the salicidation block, a salicidation layer may be deposited on the substrate and patterned using mask and etch techniques. Other techniques for forming salicidation blocks may also be useful.

Figure 2I:
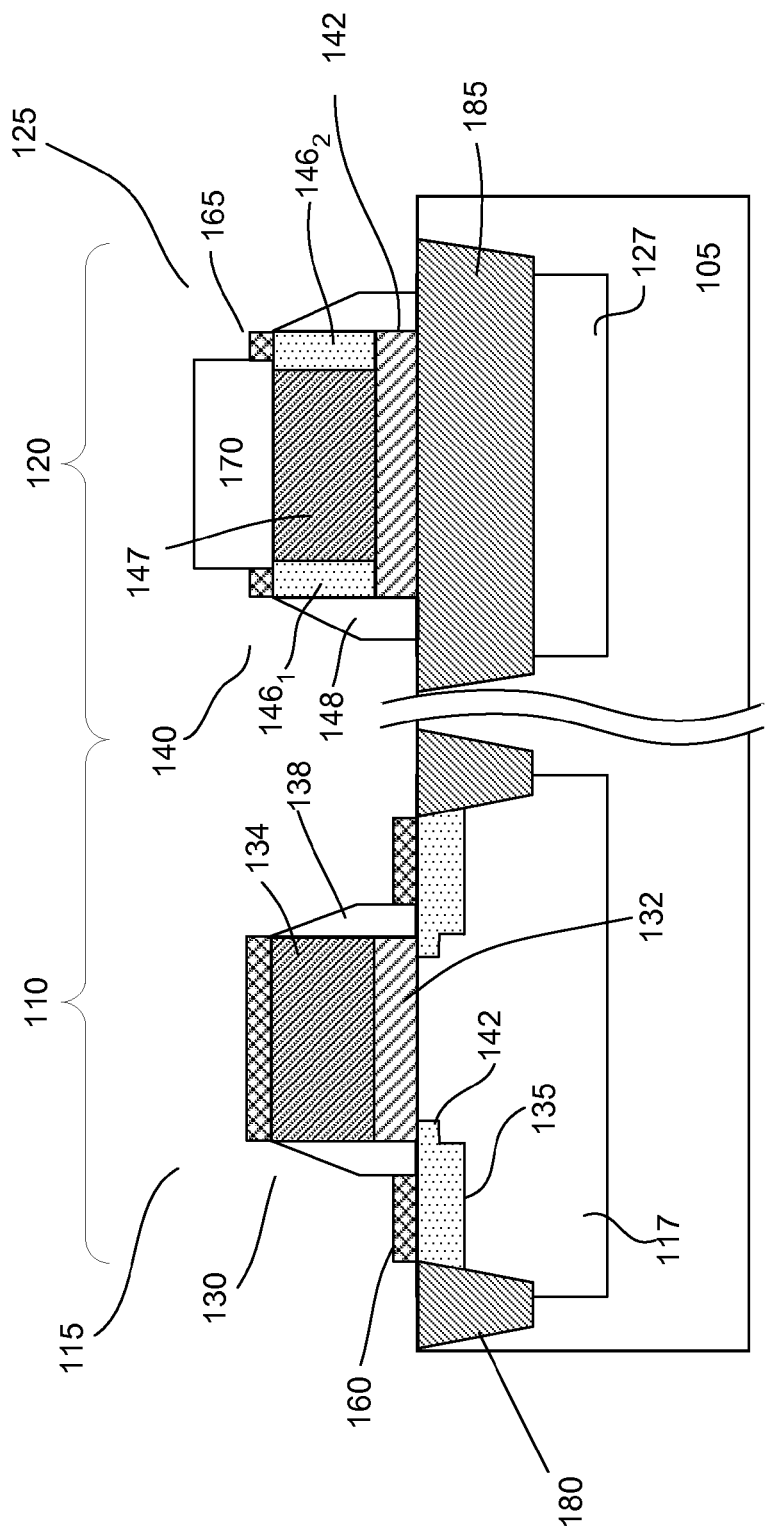

In FIG. 2*i*, metal silicide contacts are formed in the contact regions of the transistor and resistor. For example, transistor contacts 160 are formed on the surface of the S/D regions and transistor gate electrode and resistor contacts 165 are formed on the transistor gate electrode and over the resistor terminals respectively. The contacts, for example, are nickel silicide contacts. Other types of metal silicide layers may also be useful. For example, metal silicide contacts may include metals, such as titanium, cobalt, tungsten, or other metals or alloys thereof.

Forming the metal silicide contacts may be achieved by forming a metal layer and annealing it to cause a reaction with exposed silicon, such as the substrate of the S/D regions, transistor gate and terminal regions of the resistor gate. The reaction forms metal silicide contacts. Unreacted metal is removed by, for example, a wet etch, leaving the metal silicide contacts.

After forming the contacts, the process may continue to complete the device. For example, back end of line processes may be performed to form interconnects. The interconnects may be realized by one or more interconnect layers. Generally a device includes multiple metal layers. Additional processes may include testing, dicing the wafer to individual dies and packaging.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate, wherein the substrate includes a resistor region defined by a resistor isolation region and a transistor region surrounded by a transistor isolation region;
   forming a gate layer over the substrate;
   patterning the gate layer to define a resistor gate on the resistor isolation region and to define a transistor gate on the transistor region, wherein the resistor and transistor gates are separate gates;
   forming a first implant mask with at least first and second openings on the substrate after the resistor and the transistor gates are defined, wherein the first opening exposes the resistor region and the second opening exposes the transistor region;
   implanting resistor well dopants to form a resistor well in the substrate, the resistor well is disposed in the substrate below the resistor isolation region;
   implanting resistor dopants into the resistor gate to define the sheet resistance of the resistor gate;
   implanting lightly doped drain (LDD) dopants into the substrate to form LDD regions in the transistor region adjacent to the transistor gate, wherein implanting the resistor well dopants to form the resistor well, implanting the resistor dopants into the resistor gate and implanting LDD dopants to form the LDD regions are performed using the first implant mask; and
   implanting terminal dopants to form first and second resistor terminals at sides of the resistor gate, wherein a central portion of the resistor gate sandwiched by the resistor terminals serves as a resistive portion.

2. The method of claim 1 wherein implanting resistor well dopants using the first implant mask to form the resistor well in the substrate also simultaneously forms a transistor well in the transistor region.

3. The method of claim 2 where implanting resistor well dopants comprises a resistor well implant having a low tilt angle, a high energy and a low dose.

4. The method of claim 3 wherein implanting resistor well dopants comprises implanting second polarity type dopants for first polarity type transistor in the transistor region.

5. The method of claim 1 wherein implanting LDD dopants comprises a LDD implant having a high tilt angle, a low energy and an intermediate dose.

6. The method of claim 1 wherein implanting resistor dopants using the first implant mask comprises a resistor implant having a low tilt angle, a low energy and a high dose.

7. The method of claim 1 further comprising:
   removing the first implant mask;
   forming a second implant mask, the second implant mask exposes source/drain (S/D) regions in the transistor region and resistor terminal regions in the resistor gate; and
   implanting S/D dopants into the substrate to form S/D regions adjacent to the transistor gate and resistor terminals on the resistor gate unprotected by the second implant mask.

8. The method of claim 7 further comprising:
   removing the second implant mask;
   forming a salicidation block on the resistor gate protecting the resistive portion between resistor terminal regions; and
   forming contacts over the S/D regions and resistor terminal regions.

9. A method for forming a device comprising:
   providing a substrate defined with a transistor region and a resistor region, wherein a transistor gate is defined on the transistor region and a resistor gate is defined on the resistor region, wherein the transistor and resistor gates are separate gates;
   forming a first implant mask on the substrate after the resistor and the transistor gates are defined, the first implant mask includes first and second openings to expose the transistor and resistor regions;
   performing a well implant to implant well dopants having second polarity type dopants in the substrate to form a transistor well in the transistor region and a resistor well in the resistor region;
   performing a LDD implant to implant LDD dopants having first polarity type dopants in the substrate to form LDD regions in the transistor region adjacent to the transistor gate, and
   performing a resistor implant having first polarity type dopants to adjust resistance of the resistor gate, wherein the well implant, the LDD implant and the resistor implant are performed using the first implant mask.

10. The method of claim 9 comprises:
    removing the first implant mask after performing the well, LDD and resistor implants;
    forming a second implant mask exposing the transistor region and exposing resistor terminal regions of the resistor gate while protecting a resistive portion of the resistor gate between the resistor terminal regions; and performing a S/D implant to simultaneously form S/D regions in the transistor region adjacent to the transistor gate and resistor terminals in the resistor terminal regions of the resistor gate using the second implant mask.

11. The method of claim 10 comprises:

removing the second implant mask after forming the S/D regions and resistor terminals;

forming a salicidation block on the resistor gate protecting the resistive portion; and forming contacts on the S/D regions and on the resistor terminals.

12. The method of claim 9 wherein:

the well implant comprises a low tilt angle, a high energy and a low dose well implant;

the LDD implant comprises a high tilt angle, a low energy and an intermediate dose LDD implant; and the resistor implant comprises a low tilt angle, a low energy and a high dose resistor implant.

13. The method of claim 12 wherein the well implant, LDD implant and resistor implant can be performed in any order.

14. The method of claim 10 wherein the S/D regions and resistor terminals are heavily doped regions.

15. A method for forming a device comprising:

providing a substrate defined with a transistor region and a resistor region;

forming a transistor gate on the transistor region and a resistor gate on the resistor region, wherein the transistor gate and resistor gates are separate gates;

forming a first implant mask on the substrate after forming the separate transistor and resistor gates, the first implant mask includes first and second openings to expose the transistor and resistor regions;

performing a well implant to implant well dopants in the substrate to form a transistor well in the transistor region and a resistor well in the resistor region;

performing a LDD implant to implant LDD dopants in the substrate to form LDD regions in the transistor region adjacent to the transistor gate;

performing a resistor implant to adjust resistance of the resistor gate, wherein the well implant, the LDD implant and the resistor implant are performed using the first implant mask; and performing S/D implant to form S/D regions in the substrate adjacent to the transistor gate and to form resistor terminals in portions of the resistor gate.

16. The method of claim 15 wherein:

the resistor region is defined by a resistor isolation region and the transistor region is surrounded by a transistor isolation region, wherein the resistor isolation region and the transistor isolation region are distinct and separate isolation regions;

the transistor and resistor gates are formed by forming a gate dielectric layer over the transistor region and resistor region of the substrate, forming a gate electrode layer directly over the gate dielectric layer, and patterning the gate dielectric and gate electrode layers to define the transistor and resistor gates; and the well, LDD and resistor implants are performed after defining the transistor gate and resistor gate.

17. The method of claim 15 wherein:

the well implant comprises a low tilt angle, a high energy and a low dose well implant;

the LDD implant comprises a high tilt angle, a low energy and an intermediate dose LDD implant; and the resistor implant comprises a low tilt angle, a low energy and a high dose resistor implant.

* * * * *